United States Patent
Ando et al.

(10) Patent No.: US 12,238,440 B2
(45) Date of Patent: Feb. 25, 2025

(54) IMAGE SENSOR ELEMENT AND IMAGING DEVICE

(71) Applicant: NIKON CORPORATION, Tokyo (JP)

(72) Inventors: Ryoji Ando, Sagamihara (JP); Toru Takagi, Fujisawa (JP); Takashi Seo, Yokohama (JP); Yoshiyuki Watanabe, Kawasaki (JP); Shutaro Kato, Kawasaki (JP)

(73) Assignee: NIKON CORPORATION, Tokyo (JP)

( * ) Notice: Subject to any disclaimer, the term of this patent is extended or adjusted under 35 U.S.C. 154(b) by 68 days.

(21) Appl. No.: 17/279,712

(22) PCT Filed: Sep. 27, 2019

(86) PCT No.: PCT/JP2019/038357
§ 371 (c)(1),
(2) Date: Nov. 5, 2021

(87) PCT Pub. No.: WO2020/067503
PCT Pub. Date: Apr. 2, 2020

(65) Prior Publication Data
US 2024/0259710 A1  Aug. 1, 2024

(30) Foreign Application Priority Data
Sep. 28, 2018   (JP) ................................ 2018-185635

(51) Int. Cl.
*H04N 25/77* (2023.01)
*H01L 27/146* (2006.01)
*H04N 25/704* (2023.01)

(52) U.S. Cl.
CPC ........... *H04N 25/77* (2023.01); *H04N 25/704* (2023.01); *H01L 27/14621* (2013.01);
(Continued)

(58) Field of Classification Search
CPC ...... H04N 25/77; H04N 25/704; H04N 25/46; H04N 25/60; H04N 25/62; H04N 25/621;
(Continued)

(56) References Cited

U.S. PATENT DOCUMENTS

2004/0185597 A1 * 9/2004 Merrill .............. H01L 27/14621
438/70
2007/0145237 A1   6/2007 Ohkawa
(Continued)

FOREIGN PATENT DOCUMENTS

JP    2007-180336 A    7/2007
JP    2013-098700 A    5/2013
(Continued)

OTHER PUBLICATIONS

Nov. 12, 2019 International Search Report issued in International Patent Application No. PCT/JP2019/038357.
(Continued)

*Primary Examiner* — Albert H Cutler
(74) *Attorney, Agent, or Firm* — Oliff PLC

(57) ABSTRACT

An image sensor element includes: a first pixel having a first photoelectric conversion part, a first accumulation part which accumulates electric charge generated by the first photoelectric conversion part, and a first output part based on a voltage of the first accumulation part; a second pixel having a second photoelectric conversion part, a second accumulation part wherein electric charge generated by the second photoelectric conversion part, and a second output part which a second signal based on a voltage of the second accumulation part; an output line to which the first and the second output parts are connected and from which the first and second signals are output; and a control unit which is able to control the voltage of the first accumulation part to be a first voltage and ability to control the voltage of the
(Continued)

second accumulation part to be a second voltage different from the first voltage.

17 Claims, 7 Drawing Sheets

(52) U.S. Cl.
CPC .. *H01L 27/14623* (2013.01); *H01L 27/14627* (2013.01); *H01L 27/14634* (2013.01); *H01L 27/14636* (2013.01); *H01L 27/14645* (2013.01)

(58) Field of Classification Search
CPC .. H04N 25/622; H04N 25/623; H04N 25/626; H04N 25/63; H04N 25/633; H04N 25/65; H04N 25/70; H04N 25/703; H04N 25/705; H04N 25/76; H04N 25/766; H01L 27/14621; H01L 27/14623; H01L 27/14627; H01L 27/14634; H01L 27/14636; H01L 27/14645
See application file for complete search history.

(56) References Cited

U.S. PATENT DOCUMENTS

| | | | | |
|---|---|---|---|---|
| 2009/0284634 A1* | 11/2009 | Tsukimura | ............. | H04N 25/75 348/308 |
| 2013/0107331 A1 | 5/2013 | Mori | | |
| 2014/0027617 A1* | 1/2014 | Amikawa | ............. | H04N 25/63 257/229 |
| 2014/0139715 A1 | 5/2014 | Fukuoka | | |
| 2014/0333814 A1 | 11/2014 | Tashiro | | |
| 2015/0365615 A1* | 12/2015 | Oike | ............. | H04N 25/621 348/302 |
| 2017/0041563 A1* | 2/2017 | Suzuki | ............. | H04N 23/672 |
| 2017/0187972 A1* | 6/2017 | Murao | ............. | H04N 25/778 |
| 2018/0249104 A1 | 8/2018 | Sasago et al. | | |
| 2019/0006412 A1* | 1/2019 | Ando | ............. | H01L 27/14616 |

FOREIGN PATENT DOCUMENTS

| | | |
|---|---|---|
| JP | 2014-103525 A | 6/2014 |
| JP | 2014-239416 A | 12/2014 |
| JP | 2017-034606 A | 2/2017 |
| JP | 2018-139375 A | 9/2018 |
| WO | 2012/144181 A1 | 10/2012 |

OTHER PUBLICATIONS

Nov. 12, 2019 Written Opinion of the International Searching Authority issued in International Patent Application No. PCT/JP2019/038357.
May 10, 2022 Office Action issued in Japanese Patent Application No. 2020-549478.
Aug. 16, 2023 Office Action issued in Chinese Patent Application No. 201980070164.2.
Mar. 1, 2024 Office Action issued in Chinese Patent Application No. 201980070164.2.
Nov. 7, 2023 Office Action issued in Japanese Patent Application No. 2022-143608.
Aug. 22, 2024 Office Action issued in Chinese Patent Application No. 201980070164.2.

* cited by examiner (a)

(b)

IMAGE SENSOR ELEMENT AND IMAGING DEVICE

TECHNICAL FIELD

The present invention relates to an image sensor element and an imaging device.

BACKGROUND

Conventionally, an image sensor element that uses a part of pixels as an element for detecting a focus of an image formed by an imaging lens is known (for example, Patent Document 1). Output signal values differ between pixels used for focus detection and pixels used for imaging.

RELATED ART DOCUMENTS

[Patent Document]
[Patent Document 1]
Japanese Unexamined Patent Application, First Publication No. 2014-103525

SUMMARY OF INVENTION

According to a first aspect of the present invention, an image sensor element includes: a first pixel having a first photoelectric conversion part which photoelectrically converts light to generate electric charge, a first accumulation part which accumulates the electric charge generated by the first photoelectric conversion part, and a first output part which outputs a first signal based on a voltage of the first accumulation part; a second pixel having a second photoelectric conversion part which photoelectrically converts light to generate electric charge, a second accumulation part which accumulates the electric charge generated by the second photoelectric conversion part, and a second output part which outputs a second signal based on a voltage of the second accumulation part; an output line to which the first output part and the second output part are connected and from which the first signal and the second signal are output; and a control unit which is able to control the voltage of the first accumulation part to be a first voltage and is able to control the voltage of the second accumulation part to be a second voltage different from the first voltage or the first voltage.

According to a second aspect of the present invention, an imaging device includes an image sensor element according to the first aspect and a generation unit which generates image data based on the first signal.

BRIEF DESCRIPTION OF THE DRAWINGS

FIG. 2(a) is an overall view of the image sensor element, and

FIG. 2(b) is an enlarged view of a part thereof.

DESCRIPTION OF EMBODIMENTS

Embodiment of Imaging Device

Figure 1:
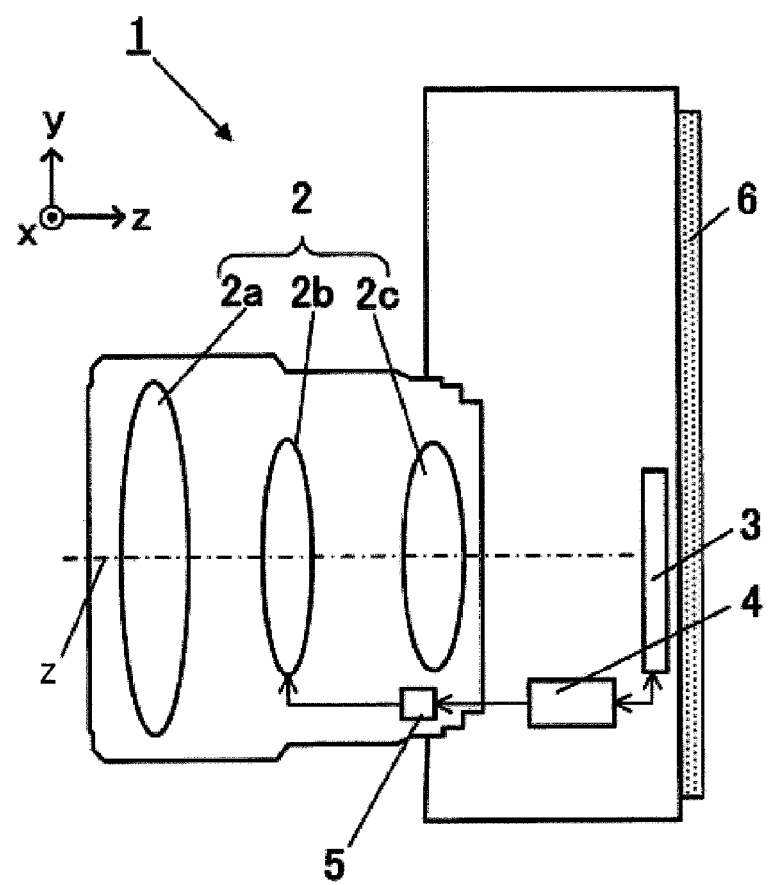
FIG. 1 is a cross-sectional view schematically showing a configuration of an imaging device.

FIG. 1 is a cross-sectional view schematically illustrating a configuration of an imaging device using an image sensor element according to a first embodiment. An imaging device 1 includes an imaging optical system 2, an image sensor element 3, a control unit 4, a lens moving unit 5, and a display unit 6.

The imaging optical system 2 forms an object image on an imaging surface of the image sensor element 3. The imaging optical system 2 includes a lens 2a, a focusing lens 2b, and a lens 2c. The focusing lens 2b is a lens for performing a focus adjustment of the imaging optical system 2. The focusing lens 2b is configured to be movable in an optical axis Z direction.

The lens moving unit 5 includes an actuator (not illustrated). The lens moving unit 5 moves the focusing lens 2b in the optical axis Z direction using the actuator. The image sensor element 3 captures an object image and outputs a signal thereof. The image sensor element 3 includes an imaging pixel and an AF pixel (focus detection pixel). The imaging pixel outputs a signal (image signal) used for image generation. The AF pixel outputs a signal (focus detection signal) used for focus detection. The control unit 4 controls each unit such as the image sensor element 3. The control unit 4 performs image processing or the like on the image signal output by the image sensor element 3 to generate image data. The control unit 4 records the image data on a recording medium (not illustrated) or displays an image based on the image data on the display unit 6. The control unit 4 can also be construed as a generation unit that generates an image based on an image signal. The display unit 6 is a display device including a display member such as, for example, a liquid crystal panel.

Also, the control unit 4 performs focus detection processing needed for automatic focusing (AF) of the imaging optical system 2 using a known phase difference detection method. Specifically, the control unit 4 detects a focusing position of the focusing lens 2b for forming an image due to the imaging optical system 2 on the imaging surface of the image sensor element 3. The control unit 4 detects an amount of image deviation between first and second images on the basis of a pair of focus detection signals output from the image sensor element 3. The control unit 4 calculates an amount of deviation (amount of defocus) between a current position and a focusing position of the focusing lens 2b on the basis of the detected amount of the image deviation. A focus adjustment is automatically performed when the focusing lens 2b is driven according to the amount of defocus.

Embodiment of Image Sensor Element

Figure 2:
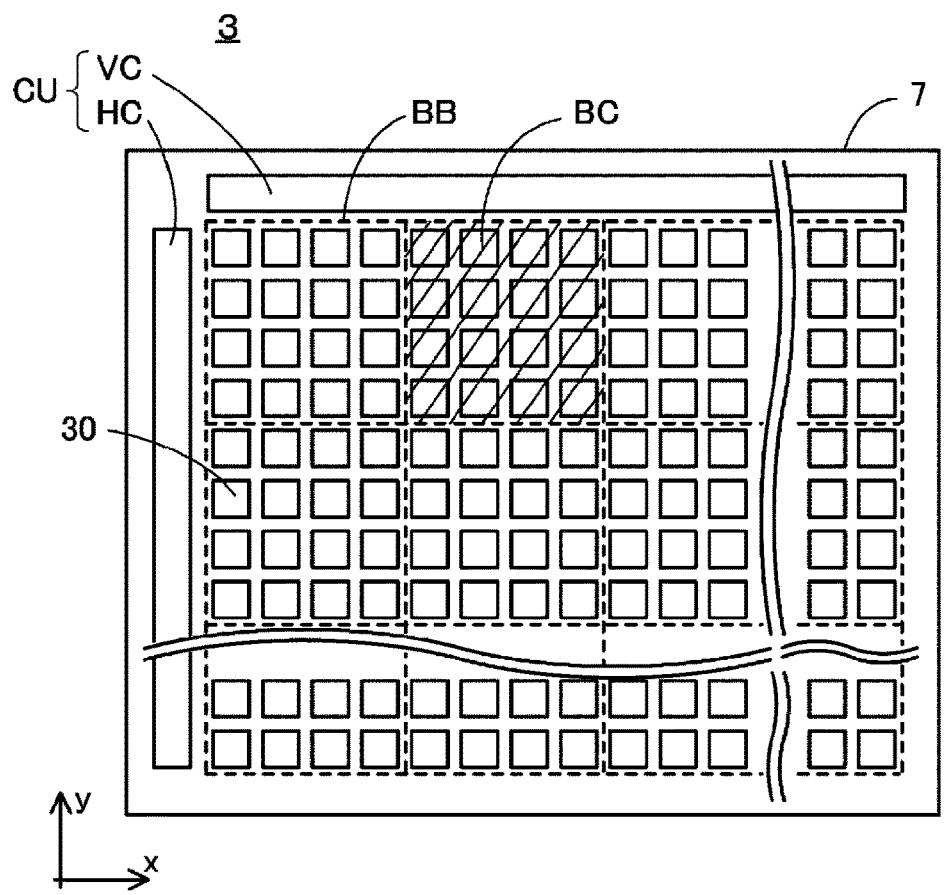
FIG. 2 is a plan view of an image sensor element seen from an imaging surface side.
Figure 2:
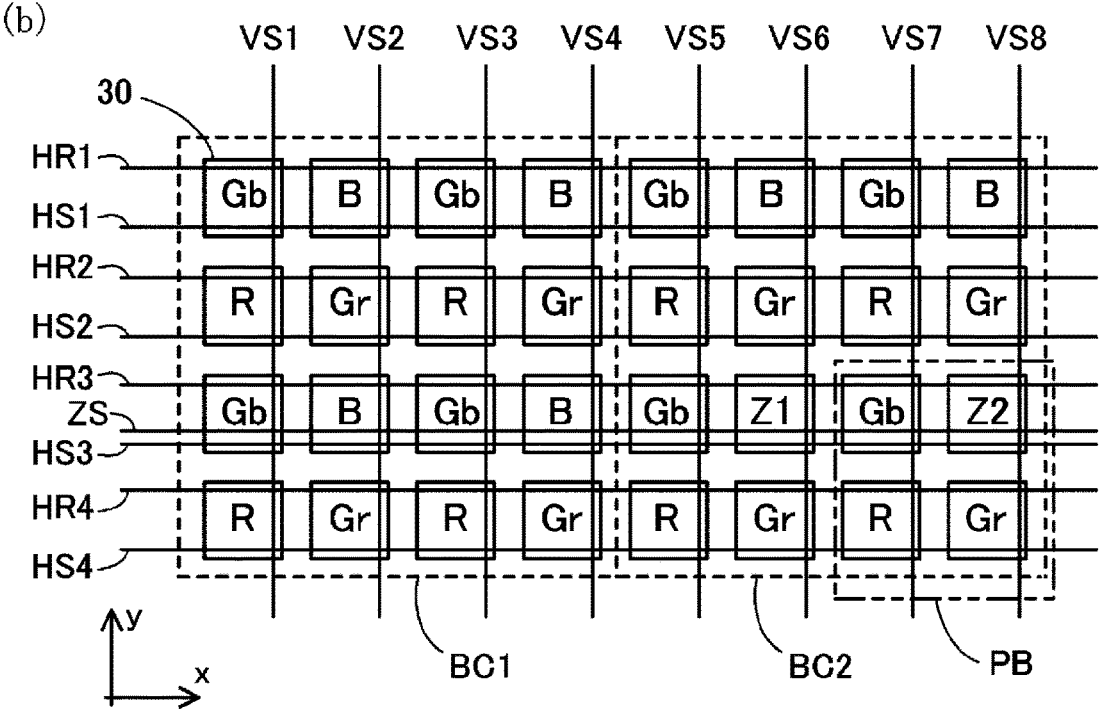

FIG. 2(a) is a view of the image sensor element 3 according to the embodiment of the present invention from the imaging surface side, that is, from the −Z side of FIG. 1. The image sensor element 3 includes a plurality of pixels 30 disposed in an x-direction and a y-direction of FIG. 2. Although FIG. 2 is drawn with a part omitted, a large number of pixels 30, for example, over a span of 1000 or more may be disposed in the x-direction and the y-direction, respectively.

In a region (imaging region) in which the plurality of pixels 30 are disposed, a horizontal control unit HC is provided at the left end in the drawing, and a vertical control unit VC is provided at the upper end in the drawing. The horizontal control unit HC and the vertical control unit VC are also collectively referred to as a control unit CU.

Configuration of Pixel Block

The image sensor element 3 includes a plurality of pixel blocks BC. In FIG. 2, one pixel block BC includes a plurality of pixels 30 disposed in the x-direction and the y-direction in a region surrounded by a boundary line BB illustrated by a broken line. The region surrounded by the boundary line BB constitutes one pixel block BC. Each output part of the plurality of pixels 30 in each of the pixel blocks BC is connected to one output line as will be described later, and each pixel 30 is connected to one reading unit. Further, the plurality of pixels 30 in each of the pixel blocks BC may be connected to a plurality of output lines and may be connected to a plurality of reading units.

In FIG. 2, a portion corresponding to one pixel block BC is hatched for easy explanation. However, all the regions each surrounded by the boundary line BB illustrated by a broken line are pixel blocks BC. The plurality of pixels 30 are divided to be disposed in a plurality of pixel blocks BC.

In the case of the example illustrated in FIG. 2, a total of 16 pixels 30 with four disposed in the x direction and four disposed in the y direction constitute one pixel block BC. The number of pixels disposed in the x-direction and the y-direction in one pixel block BC is not limited to four and may be another number such as six or eight. The number of disposed pixels may be different in the x direction and the y direction.

Also, an outer shape of the pixel block BC is not limited to the rectangle illustrated in FIG. 2 and may be any shape including a plurality of pixels 30. In this case, a shape of the boundary line BB is not a simple straight line, but a shape in which a plurality of straight lines are bent and connected.

FIG. 2(*b*) is an enlarged view of two pixel blocks BC1 and BC2 adjacent to each other in the x direction among the pixel blocks BC illustrated in FIG. 2(*a*). As illustrated in FIG. 2(*b*), color filters (color filters) of three types each having different spectral characteristics of, for example, R (red), G (green), or B (blue) are provided in the plurality of pixels 30. The R-color filter mainly transmits light in a red wavelength region, the G-color filter mainly transmits light in a green wavelength region, and the B-color filter mainly transmits light in a blue wavelength region. A pixel has different spectral characteristics according to a disposed color filter. The pixels 30 include a pixel having sensitivity to red (R) light (hereinafter referred to as R-pixel R), a pixel having sensitivity to green (G) light (hereinafter referred to as G-pixel G), and a pixel having sensitivity to blue (B) light (hereinafter, referred to as B-pixel B). These pixels 30 are disposed in a so-called Bayer array. A G-pixel Gb is a G-pixel disposed in the same y direction as a B-pixel B, and a G-pixel Gr is a G-pixel disposed in the same y direction as a R-pixel R.

The pixel block BC1 includes four G-pixels Gb, G-pixels Gr, R-pixels R, and B-pixels B disposed in a Bayer array. All of these pixels 30 are imaging pixels Gb, Gr, R, and B (hereinafter, also collectively referred to as an imaging pixel 30*c*) used for capturing an optical image formed on the imaging surface of the image sensor element 3.

A disposition of the pixels 30 inside the pixel block BC2 is almost the same as that of the pixel block BC1, but a part of the pixels in which the B-pixel B is disposed in the pixel block BC1 are replaced with special pixels Z1 and Z2 (collectively, also referred to as a special pixel ZZ) which are different from the above-described imaging pixel 30*c*.

The special pixel ZZ may be, for example, an AF pixel, and a configuration thereof will be described later.

The special pixel ZZ is not limited to an AF pixel and may be a pixel whose sensitivity is different from that of any of the above-described imaging pixel 30*c*. Also, the special pixel ZZ may be a pixel having a color filter whose spectral characteristics are different from those of any of the above-described imaging pixel 30*c*.

The pixel block BC2 includes at least one special pixel ZZ and a plurality of imaging pixels 30*c* for the plurality of pixels 30.

At least one pixel block BC among the plurality of pixel blocks BC is constituted using at least one special pixel ZZ and a plurality of imaging pixels 30*c* such as in the pixel block BC2. The plurality of pixel blocks BC of the image sensor element 3 may all be constituted of a pixel block BC2 including the special pixel ZZ. In the plurality of pixel blocks BC of the image sensor element 3, at least one may be the pixel block BC2 including the special pixel ZZ, and the other pixel blocks BC may be the pixel blocks BC which are all constituted of the imaging pixels 30*c*.

From the vertical control unit VC illustrated in FIG. 2(*a*), vertical selection lines VS1 to VS8 (collectively, also referred to as a vertical selection line VS) each connected to a selection part TV (illustrated in FIG. 3), to be described later, provided in each pixel 30 extend in the y direction. From the horizontal control unit HC, horizontal selection lines HS1 to HS4 (collectively, also referred to as a horizontal selection line HS) each connected to a selection part TH2 (illustrated in FIG. 3), to be described later, provided in each imaging pixel 30*c* extend in the x direction. From the horizontal control unit HC, a special horizontal selection line ZS connected to a selection part of each of the special pixels Z1 and Z2 to be described later also extends in the x direction.

From the horizontal control unit HC, reset voltage lines HR1 to HR4 (collectively, also referred to as a reset voltage line HR) each connected to a reset part of each pixel 30 to be described later extend in the x direction.

As illustrated in FIG. 2(*b*), the vertical selection lines VS1 to VS8 are each shared by a plurality of pixels 30 aligned in the y direction, and the horizontal selection lines HS1 to HS4 are each shared by a plurality of pixels 30*c* aligned in the x direction. The special horizontal selection line ZS is shared by a plurality of special pixels ZZ aligned in the x direction. The reset voltage lines HR1 to HR4 are each shared by a plurality of pixels 30 aligned in the x direction.

Figure 3:
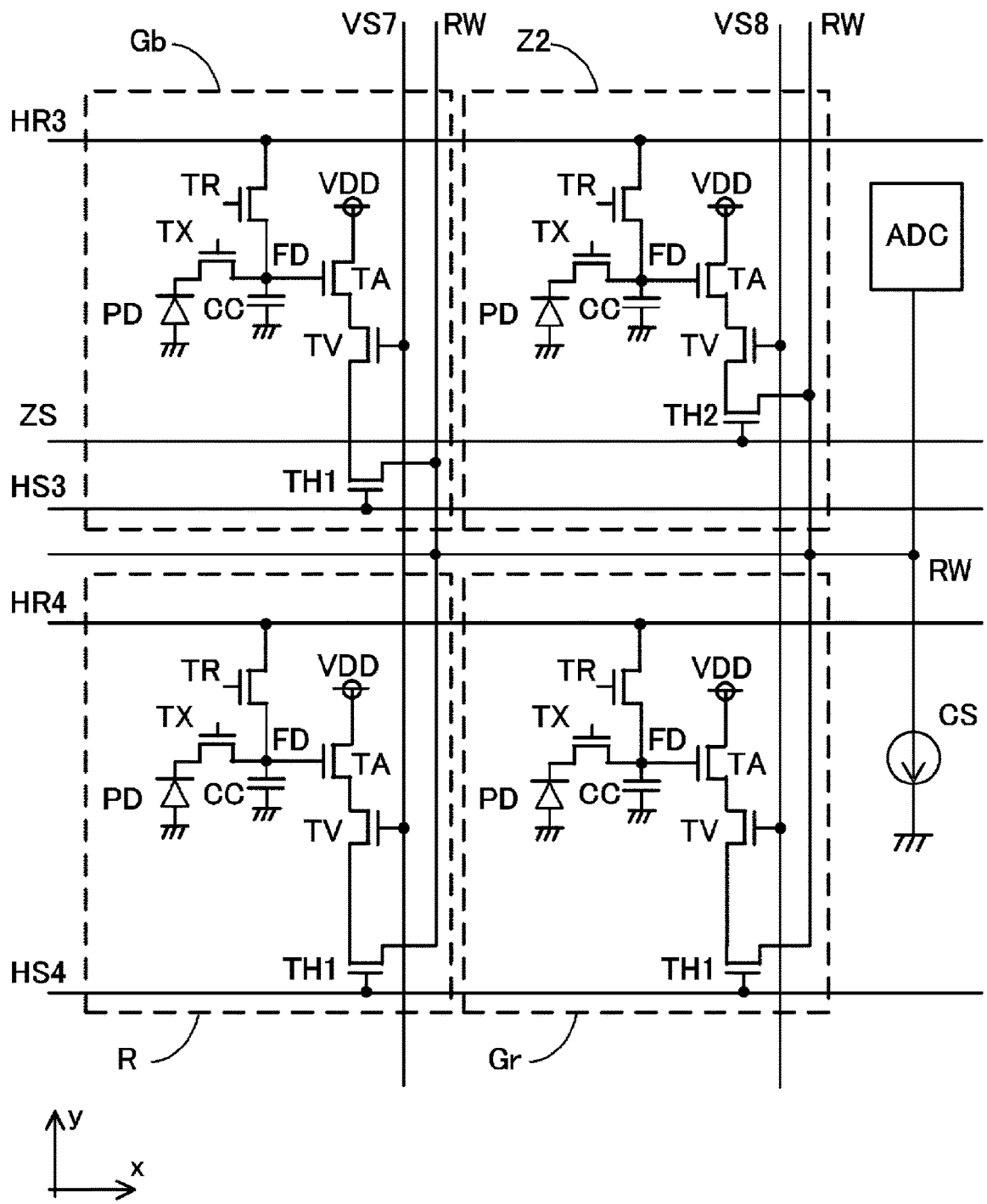
FIG. 3 is a circuit diagram of a part of pixels of the image sensor element and a read circuit.

FIG. 3 is a diagram illustrating an overview of an electric circuit of four pixels 30 (two in a vertical direction and two in a horizontal direction) in a region PB surrounded by a double-dotted-dashed line in the lower right of the pixel block BC2 illustrated in FIG. 2 (*b*). As illustrated in the region PB of FIG. 2(*b*), the four pixels 30 have the G-pixel Gb in the upper left, the special pixel Z2 in the upper right, the R-pixel R in the lower left, and the G-pixel Gr in the lower right.

All the four pixels (Gb, Z2, R, Gr) are basically 4-transistor type CMOS image sensor elements, but as will be described later, a configuration of a so-called selection transistor is different from that of a normal 4-transistor type CMOS image sensor element.

In each pixel (Gb, Z2, R, Gr), a photodiode PD, which is a photoelectric conversion part, photoelectrically converts incident light to generate electric charge and temporarily accumulates the generated electric charge. A transfer transistor TX transfers the electric charge accumulated in the photodiode PD to a floating diffusion (FD) region FD in which a capacitance CC is formed on the basis of a transfer signal sent from a transfer control line (not illustrated) to a gate thereof. An amplification transistor TA outputs a signal corresponding to the electric charge generated by the photodiode PD when a voltage generated in the FD region FD due to the transferred electric charge is applied to a gate thereof.

A power supply voltage VDD is applied to an input side (drain) of the amplification transistor TA. A reset transistor TR for resetting the FD region FD to a predetermined voltage is provided. An input side (drain) of the reset transistor TR is connected to the reset voltage line HR3 or HR4, and a predetermined voltage to be described later is supplied from the horizontal control unit HC via the reset voltage line HR.

An output side (source side) of the amplification transistor TA of each pixel (Gb, Z2, R, Gr) is connected to an input side of a vertical selection transistor TV. The vertical selection line VS7 or VS8 is connected to a gate of the vertical selection transistor TV, and the vertical selection transistor TV is controlled such that it is conductive or non-conductive by a control signal sent from the vertical control unit VC illustrated in FIG. 2(a).

An output side of the vertical selection transistor TV of the imaging pixels (Gb, R, Gr) is connected to an input side of a horizontal selection transistor TH1. That is, the vertical selection transistor TV and the horizontal selection transistor TH1 are disposed in series. A gate of the horizontal selection transistor TH1 is connected to the horizontal selection line HS3 or HS4, and the horizontal selection transistor TH1 becomes conductive or non-conductive due to a control signal sent from the horizontal control unit HC illustrated in FIG. 2(a).

In the imaging pixels (Gb, R, Gr) of the image sensor element 3 of the embodiment, the amplification transistor TA, the vertical selection transistor TV, and the horizontal selection transistor TH1 as an integrated unit may be construed as an output part or any one of them may be construed as an output part.

On the other hand, in the special pixel Z2, an output side of the vertical selection transistor TV is connected to an input side of a special horizontal selection transistor TH2. A gate of the special horizontal selection transistor TH2 is connected to the special horizontal selection line ZS, and the special horizontal selection transistor TH2 becomes conductive or non-conductive due to a control signal sent from the horizontal control unit HC illustrated in FIG. 2(a).

In the special pixel Z2 of the image sensor element 3 of the embodiment, the amplification transistor TA, the vertical selection transistor TV, and the special horizontal selection transistor TH2 can be construed as an output part as an integrated unit thereof or as any one of them.

The output part of the horizontal selection transistor TH1 of the imaging pixels (Gb, R, Gr) in the pixel block BC2 and an output part of the special horizontal selection transistor TH2 in the special pixel Z2 in the pixel block BC2 are both connected to one output line RW. Then, the output line RW is connected to a reading unit that reads signals of the pixels 30. The reading unit may include, for example, an AD conversion unit ADC that converts analog signals output from the pixels 30 into digital signals. Also, the output line RW is connected to a current source CS that supplies a current to each of the pixels 30.

The control unit CU controls a voltage of a control signal to the vertical selection line VS and the horizontal selection line HS to output a signal (output of the amplification transistor TA) of any one or more pixels (Gb, Z2, R, Gr) in the pixel block BC2 to the output line RW. The reading unit reads signals of the pixels (Gb, Z2, R, Gr) in the pixel block BC2.

Figure 4:
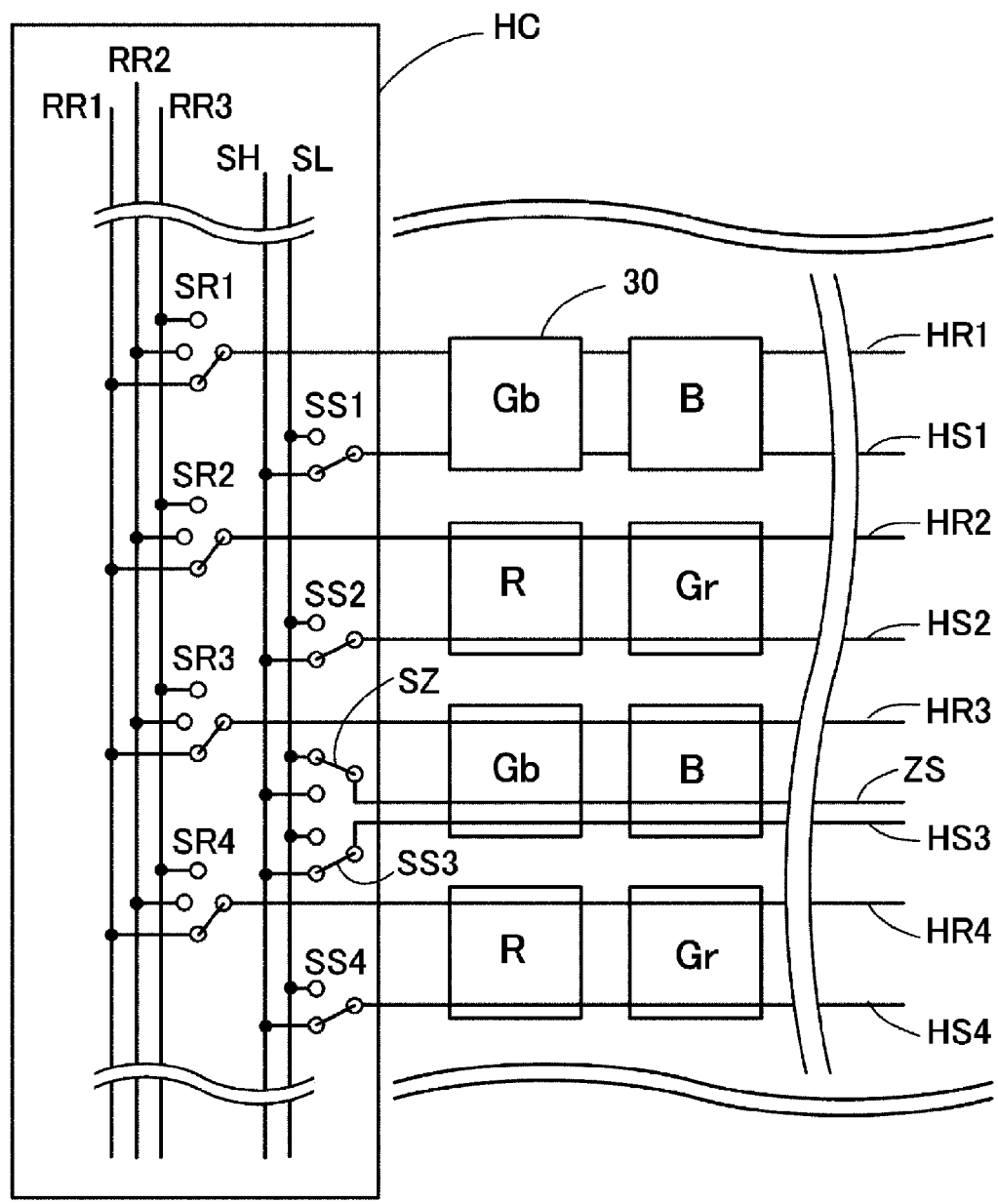
FIG. 4 is a circuit diagram of a control unit of the image sensor element.

FIG. 4 is a circuit diagram included in the horizontal control unit HC. FIG. 4 illustrates a part of a circuit included in the horizontal control unit HC, a part of the plurality of pixels 30, and a part of the horizontal selection line HS, the special horizontal selection line ZS, and a part of the reset voltage line HR which are connected to the pixels 30 in the pixel blocks BC1 and BC2 described above.

The horizontal selection lines HS are connected to selection line changeover switches SS1 to SS4 (collectively, also referred to as a selection line changeover switch SS) in the horizontal control unit HC. By the selection line changeover switch SS, the horizontal selection lines HS are each connected to be switchable between, for example, a high voltage line SH to which a high voltage such as the power supply voltage VDD is supplied and, for example, a low voltage line SL to which a low voltage such as a ground voltage GND is supplied.

For example, when the horizontal selection line HS1 is connected to the high voltage line SH, the horizontal selection transistor TH1 in the pixel 30 to which the horizontal selection line HS1 is connected is brought into a conductive state. When the horizontal selection line HS1 is connected to the low voltage line SL, the horizontal selection transistor TH1 is brought into a non-conductive state.

The special horizontal selection line ZS is connected to a special changeover switch SZ in the horizontal control unit HC. The special horizontal selection line ZS is connected to be switchable between the high voltage line SH and the low voltage line SL by the special changeover switch SZ. For example, when the special horizontal selection line ZS is connected to the high voltage line SH, the horizontal selection transistor TH2 in the pixel 30 to which the special horizontal selection line ZS is connected is brought into a conductive state. When the special horizontal selection line ZS is connected to the low voltage line SL, the horizontal selection transistor TH2 is brought into a non-conductive state.

On the other hand, each reset voltage line HR is connected to reset line changeover switches SR1 to SR4 (collectively, also referred to as a reset line changeover switch SR) in the horizontal control unit HC. By the reset line changeover switch SR, each reset voltage line HR is connected to be switchable between, for example, a first voltage line RR1 to which a first voltage such as the power supply voltage VDD is supplied, a second voltage line RR2 to which a second voltage closer to a substrate voltage than the first voltage is supplied, and a third voltage line RR3 to which a third voltage closer to the substrate voltage than the second voltage is supplied.

Any one of the first voltage, the second voltage, and the third voltage is applied to the input side of the reset transistor TR in each pixel 30 by the horizontal control unit HC via the reset voltage line HR.

The selection line changeover switch SS, the special changeover switch SZ, and the reset line changeover switch SR can all be configured by a semiconductor switch, for example, a MOS transistor circuit.

Although not illustrated, changeover switches for switching voltages applied to each vertical selection line VS are also disposed in the vertical control unit VC such as in the horizontal control unit HC illustrated in FIG. 4.

Changeover of these switches, that is, what voltage signal is sent to each of the vertical selection line VS, the horizontal selection line HS, the special horizontal selection line ZS, and the reset voltage line HR can be controlled by a control circuit in the control unit CU.

Further, the control unit CU can also control movement of the changeover switches on the basis of instructions from devices and instruments of various types on which the image sensor element is mounted.

Although not illustrated, a control line (not illustrated) similar to the horizontal selection line HS or the vertical selection line VS is connected to the gate of the transfer transistor TX and the gate of the reset transistor TR in each pixel 30 illustrated in FIG. 3 as in a conventional CMOS type image sensor element. Then, the control unit CU can control a conductive state of the transfer transistor TX and the reset transistor TR for the pixels 30 aligned in one row in the x direction or one column in the y direction using the control line.

Alternatively, the transfer transistor TX and the reset transistor TR may be configured to be controlled for each pixel 30. For this purpose, for example, the control lines may also be each configured by two directional control lines in the horizontal direction and in the vertical direction, and each of the transfer transistor TX and the reset transistor TR may be configured by two transistors disposed in series. Then, either the control line in the horizontal direction or the control line in the vertical direction may be connected to each of the gates of the two transistors.

In the image sensor element 3 of the present embodiment, signals of an arbitrary number of pixels 30 in one pixel block BC connected to one reading unit can be added together and read (binning reading) via the output line RW and the reading unit as will be described later.

Due to the binning reading, the image sensor element 3 can be easily applied to, for example, use in a low-resolution mode in which image data with a smaller number of pixels than the total number of pixels of the image sensor elements is output. In the binning reading, two or more pixels 30 in one pixel block BC are added together and read by the reading unit, thus noise incorporated into the signal of each pixel 30 is smoothed out, and thereby an image with less noise can be obtained.

A plurality of pixels 30 that are added together at the time of reading by the reading unit are preferably pixels of the same color. Therefore, the vertical control unit VC and the horizontal control unit HC control voltages of the control signals to the vertical selection line VS and the horizontal selection line HS, select two or more pixels 30 of the same color in one pixel block BC, and output signals thereof (outputs of the amplification transistors TA) to the output line RW.

Operation of Read Pixel and Clip Operation Pixel

At the time of reading a signal, when an abnormal value is output to the reading unit such as a case in which a voltage of the signal on an input side of the reading unit is less than a predetermined value, there is a likelihood that the current source CS and the reading unit will be damaged due to an excessive current flowing through the current source CS and the reading unit connected to the output line RW in the pixel block BC.

In order to prevent this, an excessive current in the image sensor element 3 of the present embodiment can be suppressed as follows. That is, at the time of reading any one or more read pixels in one pixel block BC, other arbitrary pixels 30 in one pixel block BC are used as clip operation pixels, signals of the read pixels and the clip operation pixels are added together and read, and thereby an excessive current can be suppressed.

When the clip operation pixels are added together and read, since a lower limit value of a voltage of the added-up read signal is clipped to a value by the signals from the clip operation pixels and can be prevented from being less than the value, a likelihood of the reading unit and the current source CS being damaged can be eliminated.

The clip operation pixel functions as a pixel that only outputs a constant signal for clipping and does not have to be a pixel of the same color as the read pixel. Hereinafter, an operation of reading a light intensity signal at the time of imaging or the like in the image sensor element 3 of the present embodiment will be described. First, as an example, description will be made on the assumption that the read pixel is the G-pixel (imaging pixel) Gb disposed in the upper left of FIG. 3, and the clip operation pixel is the R-pixel (imaging pixel) R disposed in the lower left of FIG. 3. However, as will be described later, any other pixel 30 may be selected as the read pixel and the clip operation pixel.

Prior to an exposure operation for imaging or focus detection, the control unit CU including the horizontal control unit HC controls the reset line changeover switch SR so that each reset voltage line HR is connected to the first voltage line RR1 to which the first voltage is supplied. Then, the control unit CU brings the reset transistor TR and the transfer transistor TX of each pixel 30 into a conductive state to reset the FD region and the photodiode PD to the above-described first voltage.

Thereafter, the control unit CU makes the transfer transistor TX non-conductive, and the photodiode PD on the image sensor element 3 is exposed for imaging, focus detection, or the like.

After the exposure, a signal based on electric charge generated by the photodiode PD due to the exposure is read using so-called correlated double sampling. The control unit CU applies a high-level voltage to the horizontal selection line HS3, the horizontal selection line HS4, and the vertical selection line VS7 to bring the vertical selection transistor TV and the horizontal selection transistor TH1 in each of the read pixel Gb and the clip operation pixel R into a conductive state. Thereby, outputs of the amplification transistors TA of the read pixel Gb and the clip operation pixel R are output to the output line RW and are added together.

Hereinafter, a timing chart shown in FIG. 5 will also be referred to and described.

Figure 5:
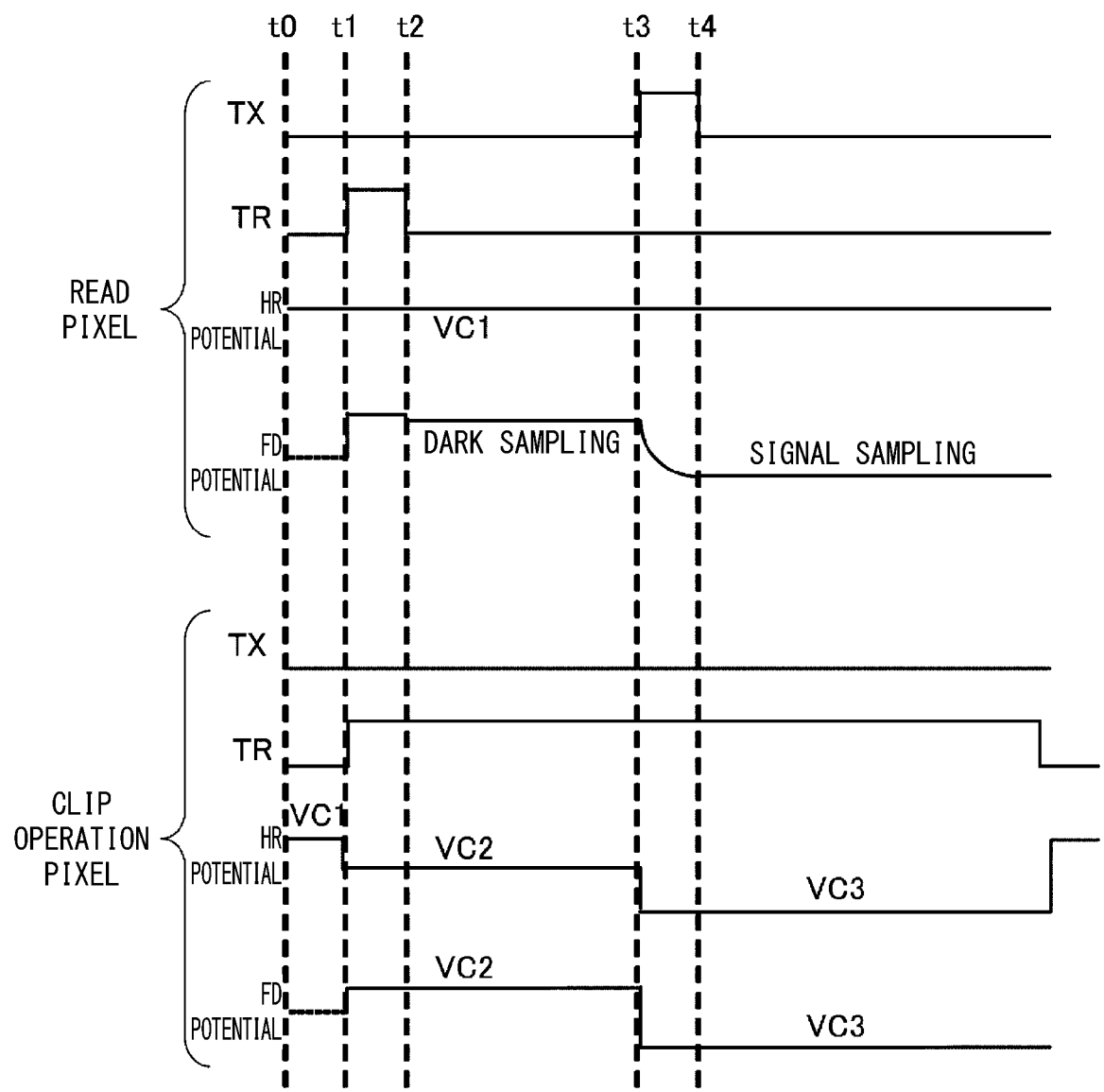
FIG. 5 is a timing chart showing an operation example of the image sensor element.

In the timing chart shown in FIG. 5, the horizontal axis represents time, and TX and TR indicate voltages of control signals input to the gates of the transfer transistor TX and the reset transistor TR of each pixel 30. As an example, since each transistor in each pixel 30 is of an nMOS type, in FIG. 5, when a control signal is at a high-level (for example, power supply voltage), a transistor to which the control signal is input is brought into a conductive state, and when a control signal is at a low-level (for example, ground voltage), a transistor to which the control signal is input is brought into a non-conductive state.

In FIG. 5, the HR voltage indicates a voltage supplied to the reset voltage line HR connected to each pixel 30, and the FD voltage indicates a voltage in the FD region of each pixel 30.

At a time $t_0$ at the start of reading, the control unit CU supplies a low-level control signal to both the gates of the transfer transistor TX and the reset transistor TR of the read pixel Gb and the clip operation pixel R. Then, the control unit CU supplies a first voltage VC1 to the reset voltage line HR of the read pixel Gb and the clip operation pixel R.

Further, the FD regions FD of the read pixel Gb and the clip operation pixel R are each reset to the first voltage in the above-described reset operation, but the voltage in the FD region FD at the time to is uncertain due to an influence of noise or the like thereafter.

Next, the control unit CU applies a high-level voltage to the gate of the reset transistor TR of the read pixel Gb from a time t1 to a time t2 to reset the FD region FD of the read pixel Gb to the first voltage VC1. As a result, the first voltage VC1 is applied to the gate of the amplification transistor TA in the read pixel Gb, and the amplification transistor TA outputs an amplification signal based on this, that is, a so-called dark signal in which electric charge accumulated in the photodiode PD is not reflected. This output is output to the output line RW via the vertical selection transistor TV and the horizontal selection transistor TH1.

On the other hand, for the clip operation pixel R, after the time t1, the control unit CU applies a high-level signal to the gate of the reset transistor TR and supplies a second voltage VC2 to the reset voltage line HR connected to the clip operation pixel R. As a result, the FD region FD of the clip operation pixel R is reset to the second voltage VC2. Therefore, the second voltage VC2 is applied to the gate of the amplification transistor TA in the clip operation pixel R, and the amplification transistor TA outputs an amplification signal based on this. This output is output to the output line RW via the vertical selection transistor TV and the horizontal selection transistor TH1.

In the image sensor element 3 of the present embodiment, a signal of the read pixel Gb and a signal of the clip operation pixel R are added together as so-called source binning. Therefore, a voltage of the signal finally read from the reading unit is substantially the same as a higher voltage of voltage signals when it is assumed that both the signals before being added together are read separately from the reading unit.

Therefore, the second voltage VC2 applied to the reset transistor TR of the clip operation pixel R is set as follows. That is, the second voltage VC2 is set so that an output voltage value of the reading unit to which only the clip operation pixel R is assumed to be connected is a value that is not higher than an assumed value of an output voltage value of the reading unit to which only the read pixel Gr that outputs a dark signal is assumed to be connected.

Specifically, since the amplification transistor TA of each pixel 30 is of an nMOS type, the second voltage VC2 is set to a voltage lower than the first voltage VC1 (to a voltage close to the ground voltage). However, if the voltage is too low, since the function of clipping the output signal will be lost, the voltage is preferably about 20 to 60% of the first voltage VC1 with the ground voltage as a reference.

The control unit CU commands the reading unit to read a signal, and in this state, a voltage applied to the input part of the reading unit is AD-converted and thereby dark sampling is performed.

Next, the control unit CU applies a high-level voltage to the gate of the transfer transistor TX of the read pixel Gb between a time t3 and a time t4 to transfer the electric charge in the photodiode PD generated due to the photoelectric conversion to the FD region. On the other hand, at the time t3, a voltage supplied to the reset voltage line HR connected to the clip operation pixel R is changed to a third voltage VC3. As a result, the FD region FD of the clip operation pixel R is reset to the third voltage VC3.

At the time t4, the control unit CU commands the reading unit to read a signal, and in this state, a voltage applied to the input part of the reading unit is AD-converted and thereby signal sampling is performed.

The third voltage VC3 is also set as follows. That is, the third voltage VC3 is set so that an output voltage value of the reading unit to which only the clip operation pixel R is assumed to be connected is a value that is not higher than an assumed value of an output voltage of the reading unit to which only the read pixel Gr is assumed to be connected.

Specifically, it is preferable that the third voltage VC3 be lower than the second voltage VC2 and set to a voltage of about 30 to 70% of the second voltage VC2 with the ground voltage as a reference.

Further, when the amplification transistor TA in each pixel 30 is of a pMOS type, a high-low relationship between the first voltage, the second voltage, and the third voltage described above is reversed.

The reading unit calculates a difference from the results of the above-described signal sampling and dark sampling and outputs it as the reading result of the light intensity signal from the read pixel Gb. Therefore, the read signal due to the dark sampling can be construed as a correction signal for correcting the read signal due to the signal sampling.

The output read by the reading unit in each pixel block BC is output from the image sensor element 3 via an output control circuit (not illustrated).

Selection of Read Pixel and Clip Operation Pixel

Next, a selection operation of the read pixel and the clip operation pixel performed by the control unit CU controlling signal levels of the vertical selection line VS, the horizontal selection line HS, and the special horizontal selection line ZS will be described with reference to FIG. 2(b) and FIG. 3.

First, a case in which all the G-pixels Gb in the pixel block BC2 illustrated in FIG. 2(b) are selected as the read pixels and two R-pixels R connected to the horizontal selection line HS4 disposed at a lowermost row in the pixel block BC2 are selected as the clip operation pixels will be described.

In this case, the control unit CU supplies the vertical selection lines VS5 and VS7 connected to the four G-pixels Gb and the two R-pixels R with a high-level voltage for making the vertical selection transistor TV conductive, and supplies the horizontal selection lines HS1, HS3, and HS4 connected to those pixels described above with a high-level voltage for making the horizontal selection transistor TH1 conductive.

On the other hand, a low-level voltage is supplied to the horizontal selection line HS2, the special horizontal selection line ZS, and the vertical selection lines VS6 and VS8 that are not connected to those pixels described above.

Thereby, of the pixels 30 in each pixel block BC2, only the signals from the four G-pixels Gb serving as the read pixels and the two R-pixels R connected to the horizontal selection line HS4 are connected to the output line RW and can be read by the reading unit.

That is, in reading by the above-described correlated double sampling, reading may be performed using the four G-pixels Gb as the read pixels and the two R-pixels R connected to the horizontal selection line HS4 as the clip operation pixels.

Specifically, the first voltage VC1 is always applied to the reset voltage lines HR1 and HR3 connected to the reset parts of the four G-pixels Gb, and a high-level voltage is applied to the reset transistor TR and the transfer transistor TX at a predetermined timing (a predetermined timing of the read pixel) shown in FIG. 5.

The first voltage VC1, the second voltage VC2, and the third voltage VC3 are sequentially applied to the reset voltage line HR4 connected to the reset parts of the two R-pixels R connected to the horizontal selection line HS4 at a predetermined timing (a predetermined timing of the clip operation pixel) shown in FIG. 5. Also, a high-level voltage is applied to the reset transistors TR of the two R-pixels R connected to the horizontal selection line HS4 at a predetermined timing.

Thereby, binning reading can be performed by using the two R-pixels R as the clip operation pixels and the four G-pixels Gb as the read pixels in the pixel block BC2.

In the above-described read operation, when a low-level voltage is applied to the horizontal selection line HS1, binning reading can also be performed by using the two G-pixels Gb connected to the horizontal selection line HS3 as the read pixels and the two R-pixels R as the clip operation pixels in the pixel block BC2.

Also, when a low-level voltage is applied also to the vertical selection line VS5, binning reading can also be performed by using one G-pixel Gb connected to the horizontal selection line HS3 and the vertical selection line VS7 as the read pixel and one R-pixel R as the clip operation pixel in the pixel block BC2.

The read pixel and the clip operation pixel can be selected from the pixels of the same color.

For example, in the pixel block BC2, a high-level voltage may be applied only to the vertical selection line VS5, a low-level voltage may be applied to the other vertical selection lines VS, a high-level voltage may be applied to the horizontal selection lines HS1 and HS3, and a low-level voltage may be applied to the horizontal selection lines HS2 and HS4.

Thereby, only the signals of the two G-pixels Gb connected to the vertical selection line VS5 can be connected to the output line RW. This is an example in which one G-pixel Gb is used as the read pixel and the other G-pixel Gb is used as the clip operation pixel, and the horizontal control unit HC controls signal levels supplied to the reset voltage line HR and the horizontal selection line HS as follows.

According to the timing chart of FIG. 5, the first voltage VC1 is always supplied to the reset voltage line HR1. On the other hand, the first voltage VC1, the second voltage VC2, and the third voltage VC3 are sequentially supplied to the reset voltage line HR3 according to the timing, and a high-level voltage is appropriately supplied to the gates of the reset transistor TR and the transfer transistor TX according to the timing. Thereby, reading can be performed by using the G-pixel Gb connected to the reset voltage line HR1 as the read pixel and the G-pixel Gb connected to the reset voltage line HR3 as the clip operation pixel.

In the above-described reading example, an example in which the G-pixel Gb is used as the read pixel has been described, but the G-pixel Gr, the R-pixel R, the B-pixel B, or the special pixel ZZ can also be used as the read pixel in the same manner.

In that case, for the clip operation pixel as well, similarly, a pixel of the same color as the read pixel can also be used, or a pixel having a color different from that of the read pixel can also be used.

When the special pixel ZZ is used as the read pixel or the clip operation pixel, in order to output a signal of the special pixel ZZ to the output line RW, a high-level voltage is applied to the special horizontal selection line ZS connected to the special pixel ZZ instead of the above-described horizontal selection line HS.

In the pixel block BC2 illustrated in FIG. 2(b), a part of the B-pixels B having high sensitivity to blue light are replaced by the special pixels Z1 and Z2, but a reading operation from the B-pixels B in the pixel block BC2 can also be performed in substantially the same manner as the reading operation from the G-pixels Gr described above.

For example, when signals are read by using the two B-pixels B as the read pixels and the two special pixels Z1 and Z2 as the clip operation pixels, a high-level voltage is applied to the horizontal selection line HS1, the special horizontal selection line ZS, the vertical selection line VS6, and the vertical selection line VS8. Then, a low-level voltage is applied to the other horizontal selection line HS and vertical selection line VS.

Thereby, only the signals of the two B-pixels B and the two special pixels Z1 and Z2 can be connected to the output line RW. Then, as in the above-described example, the above-described correlated double sampling may be performed by applying a predetermined voltage to the reset voltage line HR or the like so that the two B-pixels B serve as the read pixels and the two special pixels Z1 and Z2 serve as the clip operation pixels.

In this case, when a high-level voltage is applied to the horizontal selection line HS2 instead of the special horizontal selection line ZS and a predetermined voltage is applied to the reset voltage line HR2 according to the timing shown in FIG. 5, the two G-pixels Gr connected to the horizontal selection line HS2 can also be used as the clip operation pixels.

Further, the horizontal selection line HS3 disposed in parallel with the special horizontal selection line ZS is not connected to the special horizontal selection transistors TH2 in the special pixels Z1 and Z2. Therefore, when signals of the B-pixels B in the pixel block BC2 are read, no matter what signal the horizontal control unit HC sends to the horizontal selection line HS3, signals from the special pixels Z1 and Z2 are not mixed in the signals read from the B-pixels B.

However, since the horizontal selection line HS3 is also shared by other pixel blocks BC such as the pixel block BC1 adjacent to the pixel block BC2 in the x direction, it is preferable to apply a signal suitable for reading in the other pixel blocks BC as the signal applied to the horizontal selection line HS3.

In the same way as described above, a signal of the special pixel ZZ can be read by using the special pixel ZZ as the read pixel and the other imaging pixel 30c as the clip operation pixels.

As an example, when a signal is read with the special pixel Z2 in the region PB as the read pixel and the G-pixel Gr in the region PB as the clip operation pixel, a high-level voltage is applied to the vertical selection line VS8, the horizontal selection line HS4, and the special horizontal selection line ZS. Then, a low-level voltage is applied to the other vertical selection line VS and horizontal selection line HS.

Thereby, only the signals of the special pixel Z2 in the region PB and the G-pixel Gr in the region PB can be connected to the output line RW.

Then, as in the above-described example, the above-described correlated double sampling may be performed by applying a predetermined voltage to the reset voltage line HR or the like so that the special pixel Z2 in the region PB serves as the read pixel and the G-pixel Gr in the region PB serves as the clip operation pixel.

Reading of the signals of the pixels 30 in the pixel block BC2 has been described above, but the same applies to the other pixel blocks BC. A signal of each pixel 30 of each pixel block BC is output to the output line RW provided in each pixel block BC and is read by the reading unit. Further, also in reading pixel blocks other than the pixel block BC2, the vertical selection line VS, the horizontal selection line HS, and the special horizontal selection line ZS may be shared by the plurality of pixel blocks BC. For example, as in the pixel block BC1, the horizontal selection lines HS1 to HS4 may be connected to each pixel 30 of other pixel blocks BC aligned in the x direction with respect to the pixel block BC2. Also, the vertical selection lines VS5 to VS8 may be connected to each pixel 30 of other pixel blocks BC aligned in the y direction with respect to the pixel block BC2.

Further, a sequence of reading each signal of the special pixel ZZ and the imaging pixels (Gb, Gr, R, B) is arbitrary. For example, via the vertical selection line VS and the horizontal selection line HS, the control unit CU may first select the special pixel ZZ so that the reading unit reads an output signal thereof and then may select the imaging pixels (Gb, Gr, R, B) so that the reading unit reads output signals thereof.

Since the number of pixels of the special pixel ZZ (two of Z1 and Z2) is smaller than the number of pixels of the imaging pixel 30c (14 in total of Gb, Gr, R, and B) in the pixel block BC, a time required to read the signal of the special pixel ZZ is shorter than a time required to read the signals of the imaging pixels. That is, reading of the signal of the special pixel ZZ can be performed at a higher speed than reading of the signal of the imaging pixel 30c. For example, when the special pixel ZZ is an AF pixel, the reading of the signal of the special pixel ZZ can be performed prior to the reading of the signals of the imaging pixels (Gb, Gr, R, B), and thereby the control unit 4 can perform the focus detection at high speed.

Also, two reading units may be provided in one pixel block BC. It may be configured so that two reading units read the signal of the special pixel ZZ and the signals of the imaging pixels (Gb, Gr, R, B) by connecting the two reading units to one output line RW. Thereby, the reading units can read the signal of the special pixel ZZ and the signals of the imaging pixels (Gb, Gr, R, B) under the condition such as an optimum reading gain.

In the binning reading with the read pixel and the clip operation pixel described above, a high-level signal (transfer signal) is not applied to the gate of the transfer transistor TX in the clip operation pixel. Therefore, electric charge (photoelectric signal) generated due to exposure is stored in the photodiode PD in the pixel used as the clip operation pixel.

Therefore, after the reading by a combination of the read pixel and the clip operation pixel described above ends, at least one of the pixels used as the clip operation pixel can be used as the read pixel, and a signal thereof can be read.

In the above-described embodiment, a voltage applied to the reset part (the reset transistor TR) of the clip operation pixel may be two types of the first voltage VC1 and the second voltage VC2. Correspondingly, a voltage source connected to the reset voltage line HR by the reset line changeover switch SR in the horizontal control unit HC may be two including the first voltage line RR1 and the second voltage line RR2 to which a second voltage closer to the substrate voltage than the first voltage is is supplied.

In this case, the HR voltage (voltage supplied to the reset voltage line HR connected to the clip operation pixel) in the case of the clip operation pixel shown in FIG. 5 may be the first voltage VC1 from the time t0 to the time t1 and the second voltage VC2 after the time t1.

In this case, the second voltage VC2 may be a voltage of about 20 to 40% of the first voltage VC1 with the ground voltage as a reference.

In the above-described embodiment, the read pixel among the pixels 30 that are added together and read by source binning reading can be construed as a first pixel. On the other hand, the clip operation pixel can be construed as a second pixel.

Also, the FD region FD of each pixel 30 can be construed as an accumulation part because electric charge photoelectrically converted by the photodiode PD is transferred and accumulated here. Then, the FD region FD of the read pixel (the first pixel) can be construed as a first accumulation part, and the FD region FD of the clip operation pixel (the second pixel) can be construed as a second accumulation part.

Also, in the above-described embodiment, the pixels 30 that are added together and read by source binning may only be configured as a plurality of read pixels without using the clip operation pixel. This can be realized by not selecting the pixel used as the clip operation pixel in the above-described reading example. Specifically, at the time of the correlated double sampling, the clip operation pixel may not be selected by the vertical selection line VS, the horizontal selection line HS, and the special horizontal selection line ZS, or signals for controlling various reset voltages and the reset transistor TR may not be sent to the clip operation pixel at a predetermined timing.

In this case, any one or more of the plurality of pixels 30 that are added together and read can be construed as the first pixels, and one or more of the pixels other than the first pixel can be construed as the second pixels. Then, a voltage generated in the FD region FD of the first pixel to which electric charge generated by the photodiode PD is transferred can also be construed as a first voltage, and a voltage generated in the FD region FD of the second pixel to which electric charge generated by the photodiode PD is transferred can also be construed as a second voltage.

Figure 6:
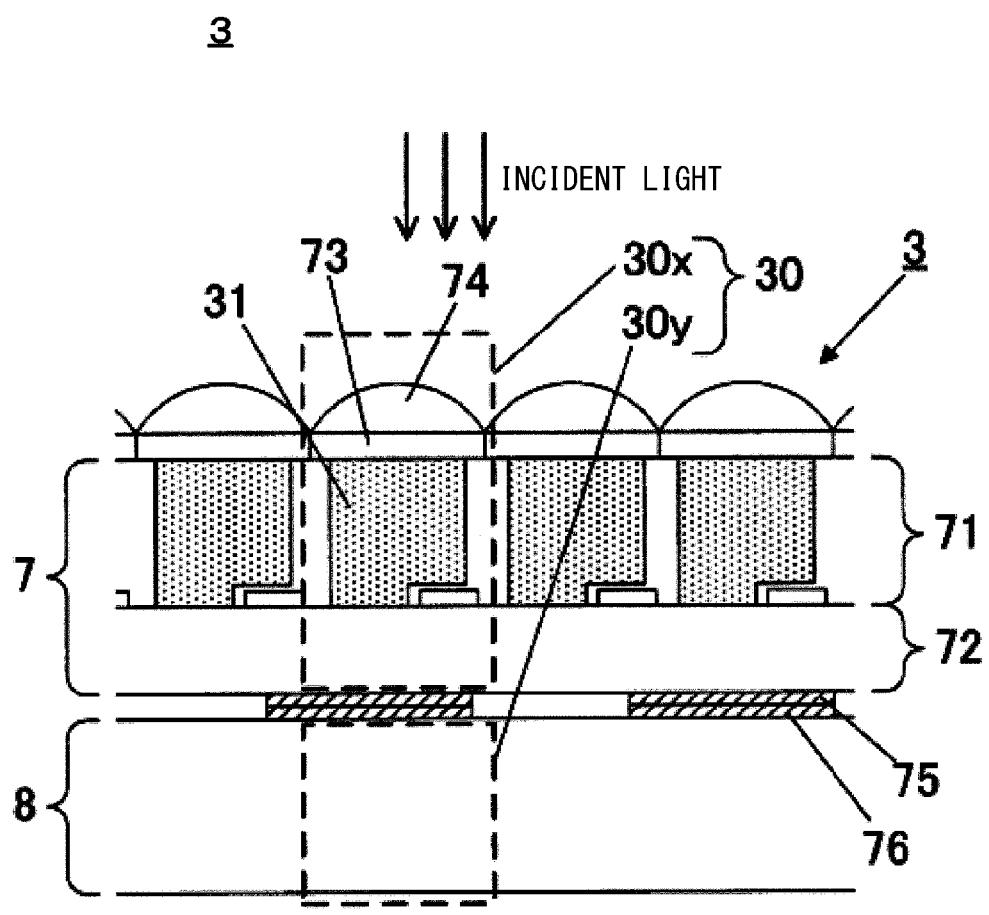
FIG. 6 is a cross-sectional view of the image sensor element.

FIG. 6 is a view illustrating a cross section of a pixel 30 portion of the image sensor element 3 of the present embodiment. Further, FIG. 6 illustrates only a part of the cross section of the entire image sensor element 3. The z-direction and the z-direction illustrated in FIG. 6 are the same as the directions illustrated in FIG. 1. The image sensor element 3 is a so-called backside illumination image sensor element. The image sensor element 3 photoelectrically converts light incident from an upper side as viewed in the drawing. The image sensor element 3 includes a first semiconductor substrate 7 and a second semiconductor substrate 8.

As described above, the image sensor element 3 includes the plurality of pixels 30. The pixels 30 each include a pixel upper portion 30x provided in the first semiconductor substrate 7 and a pixel lower portion 30y provided in the second semiconductor substrate 8. One pixel upper portion 30x includes one microlens 74, one color filter 73, one light receiving part 31 of the photodiode PD, and the like.

The first semiconductor substrate 7 includes a light receiving layer 71 having the light receiving part 31 of the photodiode PD included in the pixel upper portion 30x, and a wiring layer 72 in which transistors such as the transfer transistor TX, the amplification transistor TA, and the like are formed. The light receiving layer 71 is disposed on a side (back surface side) of the first semiconductor substrate 7 opposite to the wiring layer 72. A plurality of light receiving parts 31 are two-dimensionally disposed in the light receiving layer 71.

The pixel upper portion 30x includes the light receiving part 31 serving as a portion for photoelectrically converting incident light and can also be construed as an imaging unit.

The vertical selection transistor TV, the horizontal selection transistor TH1, the special horizontal selection transistor TH2, the vertical selection line VS, the horizontal selection line HS, the special horizontal selection line ZS, the reading unit, the current source CS, and the like which are included in the pixel lower portion 30y are disposed in the second semiconductor substrate 8.

A plurality of bumps 75 are disposed on a surface of the wiring layer 72. A plurality of bumps 76 corresponding to the plurality of bumps 75 are disposed on a surface of the second semiconductor substrate 8 facing the wiring layer 72. The plurality of bumps 75 and the plurality of bumps 76 are joined to each other. The first semiconductor substrate 7 and the second semiconductor substrate 8 are electrically connected via the plurality of bumps 75 and the plurality of bumps 76, that is, the first semiconductor substrate 7 and the second semiconductor substrate 8 are laminated.

Since the reading unit for reading signals from the plurality of pixels 30 is disposed in the second semiconductor substrate 8, it can also be construed that the reading unit is laminated on the imaging unit disposed in the first semiconductor substrate 7.

Further, the configuration of the circuit elements disposed in the first semiconductor substrate 7 and the second semiconductor substrate 8 described above is an example, and some of the components thereof may be disposed in either the first semiconductor substrate 7 or the second semiconductor substrate 8.

The light receiving layer 71 including the light receiving part 31 of the photodiode PD, the transfer transistor TX, the amplification transistor TA, the vertical selection transistor TV, the horizontal selection transistor TH2, the horizontal selection transistor TH1, the special horizontal selection transistor TH2, the horizontal selection lines HS3 and HS4, and the special horizontal selection line ZS may be formed in the first semiconductor substrate 7, and the reading unit and the current source CS may be disposed in the second semiconductor substrate 8.

The vertical control unit VC and the horizontal control unit HC may be disposed in either the first semiconductor substrate 7 or the second semiconductor substrate 8.

However, when a large number of circuit elements are disposed in the first semiconductor substrate 7, since a sufficient area or volume for disposing the light receiving part 31 cannot be secured in the first semiconductor substrate 7, the reading unit and the current source CS are preferably disposed in the second semiconductor substrate 8.

A color filter that matches spectral sensitivity characteristics of each pixel is disposed in the color filter 73 of each pixel 30.

Also, the color filter 73 is also disposed in the special pixel ZZ among the pixels 30. When the special pixel ZZ is an AF pixel, a G color filter is provided as the color filter 73. Further, the color filter 73 provided in the special pixel ZZ may be a filter that transmits the entire wavelength region of incident light. Also, the color filter 73 provided in the special pixel ZZ may be a color filter 73 having spectral characteristics different from those of any of the color filters 73 disposed in the imaging pixel 30c.

When the special pixel ZZ is a pixel for receiving infrared light, the color filter 73 has a high transmittance of infrared light and a low transmittance of visible light. Also, when the special pixel ZZ is a pixel for receiving visible light, the color filter 73 has a high transmittance for the entire wavelength region of visible light.

Further, a sensitivity of the special pixel ZZ may be made different from a sensitivity of the imaging pixel 30c by making an average transmittance of the color filter 73 of the special pixel ZZ different from an average transmittance of the color filter 73 of the imaging pixel 30c, or the like. Here, "average transmittance" refers to an average transmittance for all wavelengths of light that is photoelectrically converted by the light receiving part 31.

A sensitivity of the special pixel ZZ may be made different from a sensitivity of the imaging pixel 30c by making an area of the light receiving part 31 of the special pixel ZZ different from an area of the light receiving part 31 of the imaging pixel 30c or making conditions for ion implantation into the light receiving part 31 different.

Figure 7:
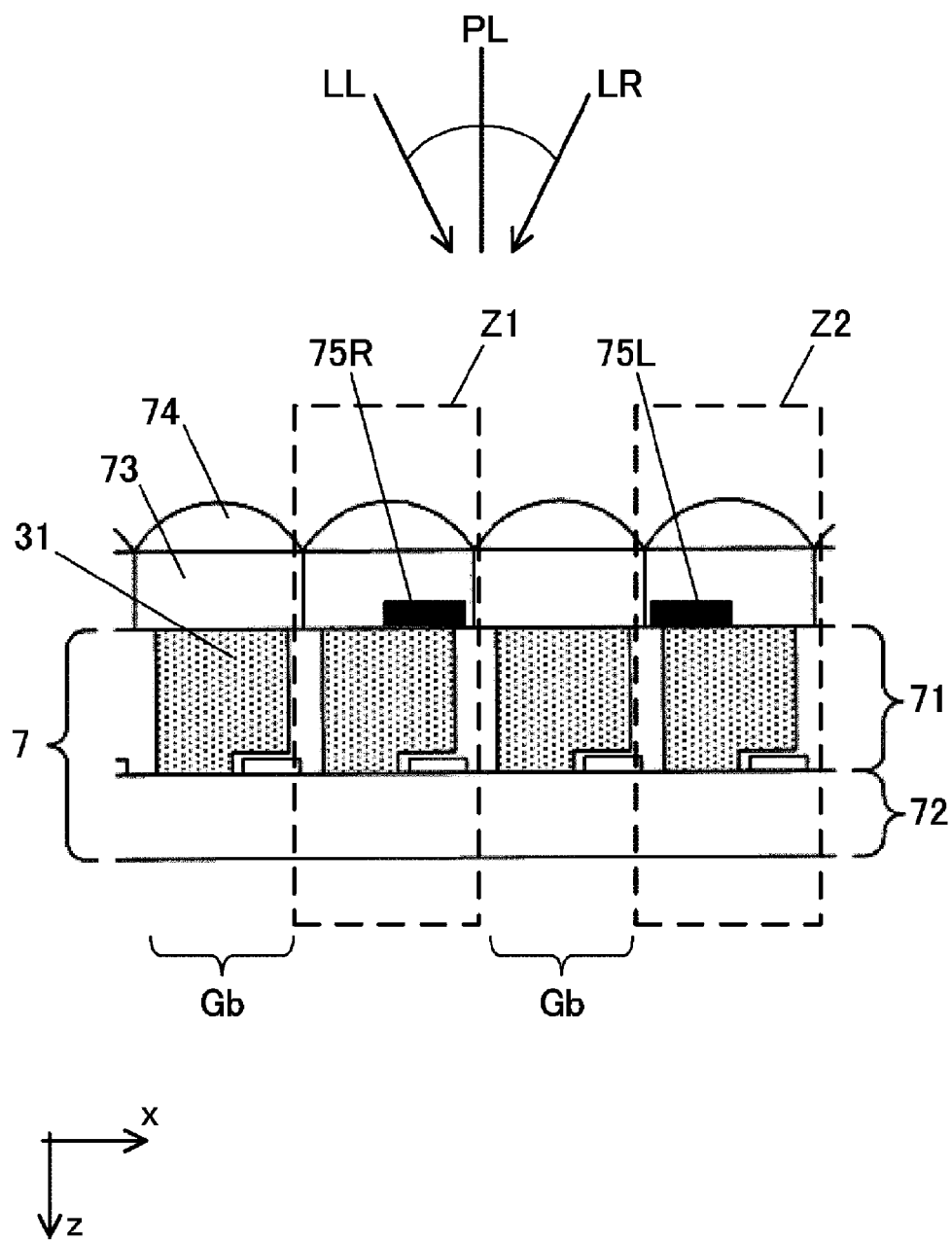
FIG. 7 is a cross-sectional view of an imaging pixel and a focus detection pixel.

FIG. 7 is a view illustrating an example of a case in which the special pixel ZZ is an AF pixel. In FIG. 7, the second semiconductor substrate 8 is omitted from the cross-sectional view of the image sensor element 3 illustrated in FIG. 6.

A special pixel Z1 includes a light shielding part 75R shielding a right side of the light receiving part 31 from light provided at a boundary part between the color filter 73 and the first semiconductor substrate 7. On the other hand, a special pixel Z2 includes a light shielding part 75L shielding a left side of the light receiving part 31 from light provided on the boundary part.

Among light incident on the special pixel Z1, light LL that is incident to be inclined in a −x direction with respect to a direction PL perpendicular to an incident surface of the image sensor element 3 is shielded by the light shielding part 75R. On the other hand, among light incident on the special pixel Z2, light LR that is incident to be inclined in a+x direction with respect to the direction PL perpendicular to the incident surface of the image sensor element 3 is shielded by the light shielding part 75L.

As a result, the special pixels Z1 and Z2 have incident directions different from each other in which a sensitivity to incident light is lowered, and conversely, the special pixels Z1 and Z2 have incident directions different from each other in which a sensitivity to incident light is relatively high.

When this image sensor element 3 is applied to the imaging device of FIG. 1, since the special pixels Z1 and Z2 serve as elements having a high sensitivity to light passing through different positions on a pupil surface of the imaging optical system 2, they function as pixels for imaging plane phase difference focus detection.

Further, positions at which the light shielding parts 75R and 75L are provided are not limited to the above-described boundary part between the color filter 73 and the first semiconductor substrate 7, and may be provided somewhere between the microlens 74 and the first semiconductor substrate 7.

In the above-described embodiment of the image sensor element, an arrangement of the pixels 30 is not necessarily limited to the Bayer array. Also, the horizontal selection line HS and the special horizontal selection line ZS may extend in a short-side direction of the image sensor element 3 instead of a long-side direction, and the vertical selection line VS may extend in the long-side direction of the image sensor element 3 instead of the short-side direction.

Also, the horizontal selection line HS, the special horizontal selection line ZS, and the vertical selection line VS that control an output of the signal of each pixel 30 do not necessarily have to extend in the horizontal direction (x direction) and the vertical direction (y direction). Then, the horizontal selection line HS, the special horizontal selection line ZS, and the vertical selection line VS do not have to be shared by the plurality of pixels 30.

Further, an output of the signal from the special pixel ZZ is often a value smaller than an output of the signal from the imaging pixel 30c due to provision of the light shielding parts 75R and 75L. Therefore, an amplifier circuit that increases an output of the signal by, for example, about twice may be incorporated inside the special pixel ZZ. Alternatively, a value thereof may be increased by adding an offset to the output signal from the special pixel ZZ.

In the above-described embodiment, the total number of the imaging pixels 30c and the B-pixel B in each pixel block BC varies depending on whether or not the special pixel ZZ is included in the pixel block BC. Therefore, when the above-described binning reading is performed, a magnitude of the added-up signal of the pixel block BC may also vary according to whether or not the pixel block BC includes the special pixel ZZ.

Therefore, in order to prevent the variation of the added-up signal, a correction circuit that increases or decreases the added-up signal of the pixel block BC including the special pixel ZZ according to the number of the special pixels ZZ included in the pixel block BC. The correction circuit may be provided in the pixel block BC or may be provided in the image sensor element 3 other than the pixel block BC. Alternatively, the correction may be performed in the control unit 4 instead of providing the correction circuit in the image sensor element 3.

For example, in the example illustrated in FIG. 2(b), the special pixel ZZ is not included in the pixel block BC1, and four G-pixels Gb, G-pixels Gr, B-pixels B, and R-pixels R are included therein. On the other hand, the pixel block BC2 includes two special pixels ZZ (Z1, Z2), includes four G-pixels Gb, G-pixels Gr, and R-pixels R, but includes only two B-pixels B. Therefore, when binning reading of the B-pixels B is performed in the pixel block BC2, the added-up signal is multiplied by (4/2). Thereby, the added-up signal at the time of binning reading of the B-pixels B can be made substantially equal in the pixel block BC1 and the pixel block BC2.

Effects of Embodiment of Image Sensor Element (1) The image sensor element 3 of the above embodiment includes a first pixel and a second pixel. The first pixel includes a photodiode (first photoelectric conversion part) PD which photoelectrically converts light to generate electric charge, a FD region (first accumulation part) FD which accumulates the electric charge generated by the photodiode PD, and a selection transistor (first output part) TH1 which outputs a first signal based on a voltage of the FD region FD, and the second pixel includes a photodiode (second photoelectric conversion part) PD which photoelectrically converts light to generate electric charge, a FD region (second accumulation part) FD which accumulates the electric charge generated by the photodiode PD, and a selection transistor (second output part) TH1 or TH2 which outputs a second signal based on a voltage of the FD region FD. The image sensor element 3 of the above embodiment further includes an output line RW to which the selection transistor TH1 of the first pixel and the selection transistor TH1 or TH2 of the second pixel are connected and from which the first signal and the second signal are output, and a control unit CU which can control the voltage of the FD region FD of the first pixel such that it is a first voltage and control the voltage of the FD region FD of the second pixel such that it is a second voltage different from the first voltage or such that it is the first voltage.

With such a configuration, there is an effect that the output of any one or a plurality of pixels 30 can be selected from the plurality of pixels connected to the output line RW and output to the output line RW.

(2) Further, the control unit CU can also control the second accumulation part such that it has the second voltage while the first output part outputs the first signal. Thereby, even when the first signal has an abnormal value exceeding a predetermined range, an excessive current is prevented from being generated in a current source IS, and damage to the image sensor element 3 can be prevented.

Although various embodiments and modified examples have been described above, the present invention is not limited to these contents. Also, each of the embodiments and modified examples may be applied alone or may be used in combination. Other aspects conceivable in the scope of the technical spirit of the present invention are also included in the scope of the present invention.

The contents disclosed in the following priority basic application is incorporated herein by reference.

Japanese Patent Application No. 2018-185635 (filed on Sep. 28, 2018)

DESCRIPTION OF THE REFERENCE SYMBOLS

1 Imaging device
2 Imaging lens
3 Image sensor element
4 Control unit (generation unit)
5 Lens moving unit
7 First semiconductor substrate
8 Second semiconductor substrate
BC, BC1, BC2 Pixel block
HC Horizontal control unit
VC Vertical control unit
CU Control unit
30 Pixel
Gr, Gb G-pixel
R R-pixel
B B-pixel
Z1, Z2 Special pixel
VS, VS1 to HS8 Vertical selection line
HS, HS1 to HS4 Horizontal selection line
ZS special horizontal selection line
HR, HR1 to HR4 Reset voltage line
PD Photodiode
TX Transfer transistor
TR Reset transistor
TA Amplification transistor
TV Vertical selection transistor
TH1 Horizontal selection transistor
TH2 Special horizontal selection transistor
RW Read line
ADC Reading unit
31 Photosensitive unit
73 Color filter

What is claimed is:
1. An image sensor element comprising:
a first pixel including:
a first photoelectric conversion part which photoelectrically converts light to generate electric charge;

a first accumulation part which accumulates the electric charge generated by the first photoelectric conversion part; and a first output part which outputs a first signal based on a voltage of the first accumulation part;

a second pixel including:

a second photoelectric conversion part which photoelectrically converts light to generate electric charge;

a second accumulation part which accumulates the electric charge generated by the second photoelectric conversion part; and a second output part which outputs a second signal based on a voltage of the second accumulation part;

an output line to which the first output part and the second output part are connected and from which the first signal and the second signal are output;

a first wiring for causing the voltage of the first accumulation part and the voltage of the second accumulation part to be a first voltage;

a second wiring for causing the voltage of the second accumulation part to be a second voltage different from the first voltage; and a control unit which controls the voltage of the first accumulation part via the first wiring and controls the voltage of the second accumulation part via the second wiring.

2. The image sensor element according to claim 1, wherein the control unit controls the second accumulation part to have the second voltage while the first output part outputs the first signal.

3. The image sensor element according to claim 1, comprising a plurality of the first pixels, wherein the control unit controls the voltage of the second accumulation part to be the second voltage while a plurality of the first output parts each output the first signal.

4. The image sensor element according to claim 3, wherein the control unit controls the voltage of the second accumulation part to be the second voltage while the plurality of the first output parts simultaneously output the first signals.

5. The image sensor element according to claim 1, wherein the control unit controls the voltage of the second accumulation part to be the first voltage for at least a part of a time when the first output part does not output the first signal.

6. The image sensor element according to claim 1, wherein the voltage of the first accumulation part is a voltage based on the electric charge generated by the first photoelectric conversion part and accumulated in the first accumulation part.

7. The image sensor element according to claim 1, wherein the control unit controls the voltage of the second accumulation part to be the second voltage or a third voltage different from the first voltage and the second voltage.

8. The image sensor element according to claim 7, wherein the control unit controls the voltage of the second accumulation part to be the third voltage after controlling the voltage of the second accumulation part to be the second voltage.

9. The image sensor element according to claim 7, wherein the first output part outputs a signal used for correcting the first signal while the voltage of the second accumulation part is the second voltage, and outputs the first signal while the voltage of the second accumulation part is the third voltage.

10. The image sensor element according to claim 7, further comprising a third wiring which causes the voltage of the second accumulation part to be the third voltage, wherein the control unit controls the voltage of the second accumulation part via the third wiring.

11. The image sensor element according to claim 1, comprising a plurality of the first pixels connected to the output line, wherein the first pixels each include a first filter having first spectral characteristics, and the first photoelectric conversion part photoelectrically converts light that has been transmitted through the first filter.

12. The image sensor element according to claim 1, wherein at least one of the first pixel and the second pixel outputs a signal used for focus detection.

13. The image sensor element according to claim 1, further comprising a reading unit laminated with an imaging unit including the first pixel and the second pixel and configured to read the first signal and the second signal from the output line.

14. An imaging device comprising:

an image sensor element according to claim 1; and a generation unit which generates image data based on the first signal.

15. An image sensor element comprising:

a first pixel including:

a first photoelectric conversion part which photoelectrically converts light to generate electric charge;

a first accumulation part which accumulates the electric charge generated by the first photoelectric conversion part; and a first output part which outputs a first signal based on a voltage of the first accumulation part;

a second pixel including:

a second photoelectric conversion part which photoelectrically converts light to generate electric charge;

a second accumulation part which accumulates the electric charge generated by the second photoelectric conversion part; and a second output part which outputs a second signal based on a voltage of the second accumulation part;

an output line to which the first output part and the second output part are connected and from which the first signal and the second signal are output;

a first wiring for causing voltages of the first accumulation part and the second accumulation part to be a first voltage;

a second wiring for causing the voltages of the first accumulation part and the second accumulation part to be a second voltage different from the first voltage; and a control unit which controls the voltages of the first accumulation part and the second accumulation part via the first wiring and the second wiring.

16. The image sensor element according to claim 15, wherein the control unit controls the voltage of the second accumulation part to be the second voltage via the second wiring while the first output part outputs the first signal and controls the voltage of the first accumulation part to be the second voltage via the second wiring while the second output part outputs the second signal.

17. An imaging device comprising:
an image sensor element according to claim 15; and
a generation unit which generates image data based on the first signal.

\* \* \* \* \*